US012622027B2

(12) United States Patent
Uehigashi

(10) Patent No.: US 12,622,027 B2
(45) Date of Patent: May 5, 2026

(54) SILICON CARBIDE WAFER AND SILICON CARBIDE SEMICONDUCTOR DEVICE INCLUDING THE SAME

(71) Applicants: DENSO CORPORATION, Kariya-city (JP); TOYOTA JIDOSHA KABUSHIKI KAISHA, Toyota (JP); MIRISE Technologies Corporation, Nisshin (JP)

(72) Inventor: Hideyuki Uehigashi, Nisshin (JP)

(73) Assignees: DENSO CORPORATION, Kariya-city (JP); TOYOTA JIDOSHA KABUSHIKI KAISHA, Toyota (JP); MIRISE Technologies Corporation, Nisshin (JP)

( * ) Notice: Subject to any disclaimer, the term of this patent is extended or adjusted under 35 U.S.C. 154(b) by 389 days.

(21) Appl. No.: 18/507,621

(22) Filed: Nov. 13, 2023

(65) Prior Publication Data

US 2024/0213332 A1 Jun. 27, 2024

(30) Foreign Application Priority Data

Dec. 26, 2022 (JP) ................................. 2022-208927

(51) Int. Cl.
*H01L 29/16* (2006.01)
*H10D 62/60* (2025.01)
(Continued)

(52) U.S. Cl.
CPC ......... *H10D 62/60* (2025.01); *H10D 62/8325* (2025.01); *H10D 30/668* (2025.01)

(58) Field of Classification Search
CPC ............. H10D 12/038; H10D 30/0297; H10D 30/668; H10D 62/157; H10D 62/393; H10D 62/60; H10D 62/8325
See application file for complete search history.

(56) References Cited

U.S. PATENT DOCUMENTS

| | | |
|---|---|---|
| 2003/0079676 A1 | 5/2003 | Ellison et al. |
| 2006/0137600 A1 | 6/2006 | Ellison et al. |

(Continued)

FOREIGN PATENT DOCUMENTS

JP 2003-086518 A 3/2003

OTHER PUBLICATIONS

Salemi, A. et al., "Conductivity Modulated and Implantation-Free 4H—SiC Ultra-High-Voltage PIN Diodes", Materials Science Forum, Jun. 5, 2018, pp. 568-572, vol. 924.

(Continued)

*Primary Examiner* — Jaehwan Oh
(74) *Attorney, Agent, or Firm* — Posz Law Group, PLC

(57) ABSTRACT

A silicon carbide wafer includes: a substrate made of silicon carbide; and an epitaxial layer made of silicon carbide and arranged on the substrate. A chip formation region is defined in which a semiconductor element is formed, and an outer peripheral region is defined to surround the chip formation region. The epitaxial layer has a trap density of $1.0 \times 10^{13}$ $cm^{-3}$ or less at an activation energy of 0.10 to 0.20 eV derived by a DLTS method in the chip formation region. The substrate has a Ti density of $1.0 \times 10^{17}$ $cm^{-3}$ or less measured by a SIMS method and a Cr density of $1.0 \times 10^{17}$ $cm^{-3}$ or less measured by a SIMS method.

6 Claims, 2 Drawing Sheets

(51) Int. Cl.
　　*H10D 62/832*　　　(2025.01)
　　*H10D 30/66*　　　(2025.01)

(56)　　　　　References Cited

U.S. PATENT DOCUMENTS

| | | | |
|---|---|---|---|
| 2009/0114924 A1 | 5/2009 | Ellison et al. | |
| 2012/0091471 A1 | 4/2012 | Ellison et al. | |
| 2013/0059429 A1* | 3/2013 | Danno | H01L 21/0485 |
| | | | 257/E21.09 |
| 2014/0217407 A1* | 8/2014 | Mizushima | H01L 21/263 |
| | | | 438/16 |
| 2016/0247894 A1* | 8/2016 | Hamada | H01L 21/046 |
| 2016/0336390 A1* | 11/2016 | Hamada | H10D 12/481 |
| 2017/0301751 A1* | 10/2017 | Agata | H10D 62/53 |
| 2018/0274125 A1 | 9/2018 | Eto et al. | |
| 2019/0237547 A1 | 8/2019 | Tawara et al. | |
| 2019/0371885 A1* | 12/2019 | Mori | H10D 8/60 |
| 2020/0098565 A1* | 3/2020 | Tanaka | H01L 21/26546 |
| 2020/0325595 A1 | 10/2020 | Eto et al. | |
| 2021/0305049 A1* | 9/2021 | Sato | H10D 30/66 |
| 2022/0173001 A1 | 6/2022 | Ishibashi et al. | |
| 2022/0262638 A1* | 8/2022 | Nakamura | H10D 8/01 |
| 2022/0285501 A1 | 9/2022 | Ichikawa | |
| 2025/0159957 A1 | 5/2025 | Ichikawa | |

OTHER PUBLICATIONS

Lebedev, A., "Deep Level Centers in Silicon Carbide: A Review",
Semiconductors, Feb. 1999, pp. 107-130, vol. 33, No. 2.

* cited by examiner

SILICON CARBIDE WAFER AND SILICON CARBIDE SEMICONDUCTOR DEVICE INCLUDING THE SAME

CROSS REFERENCE TO RELATED APPLICATION

This application is based on Japanese Patent Application No. 2022-208927 filed on Dec. 26, 2022, the disclosure of which is incorporated herein by reference.

TECHNICAL FIELD

The present disclosure relates to a silicon carbide wafer made of silicon carbide and a silicon carbide semiconductor device using the silicon carbide wafer.

BACKGROUND

A silicon carbide (SiC) semiconductor device includes a semiconductor element such as a MOSFET formed using a SiC wafer. The SiC wafer is formed by growing an epitaxial layer of SiC on a substrate formed of SiC.

SUMMARY

According to an aspect of the present disclosure, a silicon carbide wafer includes: a substrate made of silicon carbide; and an epitaxial layer made of silicon carbide and arranged on the substrate. A chip formation region is defined in which a semiconductor element is formed, and an outer peripheral region is defined to surround the chip formation region. The epitaxial layer has a trap density of $1.0 \times 10^{13}$ cm$^{-3}$ or less at an activation energy of 0.10 to 0.20 eV derived by a DLTS method in the chip formation region. The substrate has a Ti density of $1.0 \times 10^{17}$ cm$^{-3}$ or less measured by a SIMS method and a Cr density of $1.0 \times 10^{17}$ cm$^{-3}$ or less measured by a SIMS method.

DETAILED DESCRIPTION

Figure 1:
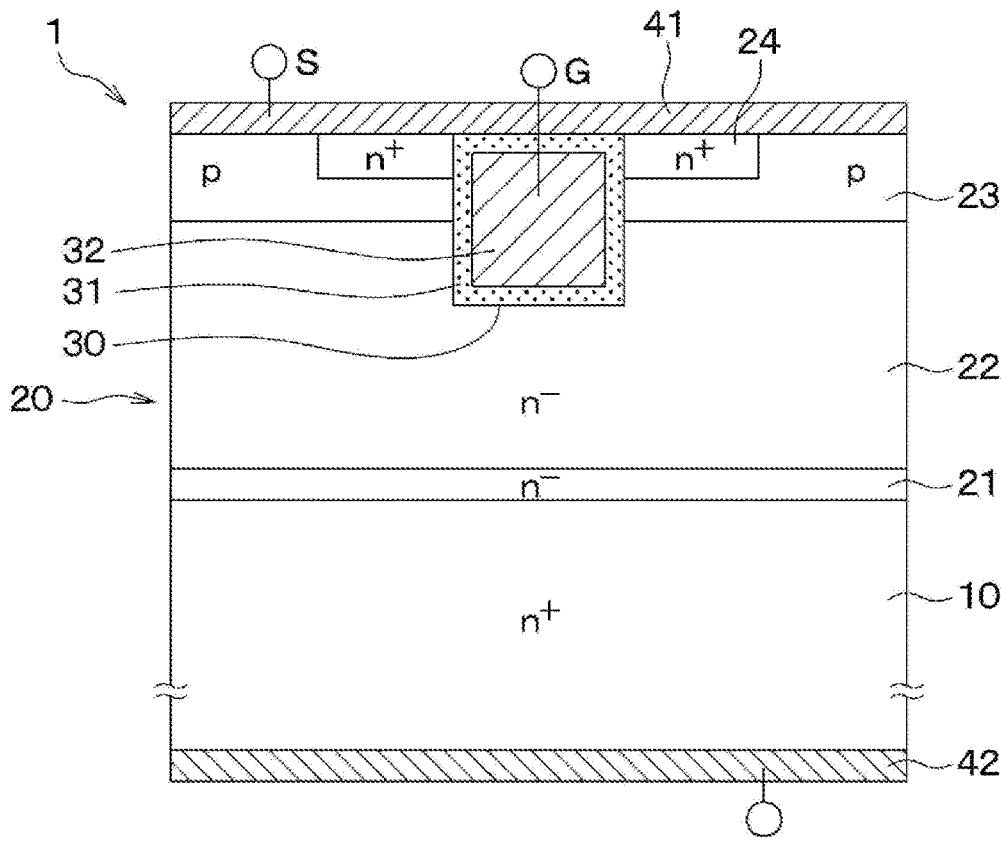
FIG. 1 is a cross-sectional view of a SiC semiconductor device according to an embodiment.

Conventionally, there has been proposed a silicon carbide (SiC) semiconductor device in which a SiC wafer is used to form a semiconductor element such as a MOSFET. MOSFET is an abbreviation for Metal Oxide Semiconductor Field Effect Transistor. The SiC wafer is formed by growing an epitaxial layer of SiC on a substrate formed of SiC.

For example, the SiC semiconductor device in which the MOSFET is formed has the following configuration. The MOSFET includes an n-type substrate, an n-type drift layer disposed on the substrate, a p-type base layer disposed on the drift layer, and an n-type source region formed in a surface layer portion of the base layer. The MOSFET includes a trench gate structure formed to penetrate the source region and reach the drift layer, a first electrode electrically connected to the base layer and the source region, and a second electrode connected to the substrate.

Such a SiC semiconductor device is configured as follows. A SiC wafer is formed by disposing an n-type epitaxial layer on a wafer-like substrate. Then, ion implantation or the like is performed to form a base layer, a source region, and the like. The SiC wafer is divided into chips. Note that the drift layer is constituted by a portion of the epitaxial layer that is different from a portion constituting the base layer or the source region.

The SiC semiconductor device is expected to replace the existing semiconductor device formed of silicon over a wide voltage range, specifically, an application range of 100 V to 10 kV or more. In this case, in order to obtain an ultrahigh breakdown voltage device in which the breakdown voltage of the SiC semiconductor device exceeds 10 kV, an epitaxial layer having a low concentration (i.e., the drift layer) is required in order to obtain a conductivity modulation effect. For example, the impurity concentration of the epitaxial layer may be $1.0 \times 10^{14}$ cm$^{-3}$ or less in order to obtain an ultra-high breakdown voltage device.

The present inventor conducts intensive studies on the establishment of a technique for producing an epitaxial layer (that is, the drift layer) applicable to all of the above-described voltage range. Specifically, the inventor intensively studies a technique for intentionally controlling the impurity concentration of the epitaxial layer. Then, the present inventor focuses on the fact that it is necessary to reduce the influence of the trap density in the epitaxial layer in order to make the impurity concentration of the epitaxial layer $1.0 \times 10^{14}$ cm$^{-3}$ or less. It is known that Ti (titanium) or Cr (chromium) acts as n-type impurities by forming a level at a position shallow from a conduction band when being taken into an epitaxial layer, such that the breakdown voltage of the SiC semiconductor device is affected. In order to make the trap density of the epitaxial layer less likely to affect the breakdown voltage, the trap density of the epitaxial layer is preferably about 10% lower than the impurity concentration of the epitaxial layer. That is, in order to set the impurity concentration of the epitaxial layer to $1.0 \times 10^{14}$ cm$^{-3}$ or less, the trap density of the epitaxial layer is preferably set to $1.0 \times 10^{13}$ cm$^{-3}$ or less. In case of a device having a lower breakdown voltage, for example, about 1 kV, the impurity concentration of the epitaxial layer is $0.5 \times 10^{16}$ cm$^{-3}$ to $5.0 \times 10^{16}$ cm$^{-3}$. In this case, since the impurity concentration control is facilitated, if the trap density of the epitaxial layer can be set to $1.0 \times 10^{13}$ cm$^{-3}$ or less, an epitaxial layer for manufacturing a device in a different voltage region is also included.

The present disclosure provides a SiC wafer and a SiC semiconductor device in which the trap density of an epitaxial layer is $1.0 \times 10^{13}$ cm$^{-3}$ or less.

According to a first aspect of the present disclosure, a silicon carbide wafer includes: a substrate made of silicon carbide; and an epitaxial layer made of silicon carbide and arranged on the substrate. A chip formation region is defined in which a semiconductor element is formed, and an outer peripheral region is defined to surround the chip formation region. The epitaxial layer has a trap density of $1.0 \times 10^{13}$ cm$^{-3}$ or less at an activation energy of 0.10 to 0.20 eV derived by a DLTS method in the chip formation region. The substrate has a Ti density of $1.0 \times 10^{17}$ cm$^{-3}$ or less measured by a SIMS method and a Cr density of $1.0 \times 10^{17}$ cm$^{-3}$ or less measured by a SIMS method.

Accordingly, since the trap density caused by Ti and Cr in the epitaxial layer can be set to $1.0 \times 10^{13}$ cm$^{-3}$ or less, it is possible to obtain a SiC wafer capable of manufacturing a device having an ultrahigh breakdown voltage. In addition, before the epitaxial layer is grown on the substrate, it is only necessary to confirm whether or not each of the Ti density and the Cr density of the substrate is $1.0 \times 10^{17}$ cm$^{-3}$ or less by the SIMS method. A highly reliable SiC semiconductor device can be manufactured without significantly increasing the number of manufacturing steps. Similarly, after the epitaxial layer is grown on the substrate, it is only necessary to confirm whether or not each trap density of Ti and Cr in the epitaxial layer is $1.0 \times 10^{13}$ cm$^{-3}$ or less by the DLTS method. A highly reliable SiC semiconductor device can be obtained without significantly increasing the number of manufacturing steps.

According to a second aspect of the present disclosure, a SiC semiconductor device includes the substrate and the epitaxial layer according to the first aspect, and a semiconductor element is formed in which a current flows along a stacking direction of the substrate and the epitaxial layer.

Accordingly, the SiC semiconductor device can have an ultrahigh breakdown voltage.

Hereinafter, an embodiment of the present disclosure will be described with reference to the drawings. In the following embodiments, the same reference numerals are assigned to parts that are the same or equivalent to each other to describe the same.

An embodiment will be described with reference to the drawings. In the present embodiment, a SiC semiconductor device 1 includes a metal oxide semiconductor field effect transistor (MOSFET) serving as a semiconductor element. Although not particularly illustrated, the SiC semiconductor device 1 includes a cell region and a peripheral region formed to surround the cell region. The MOSFET shown in FIG. 1 is formed in the cell region of the SiC semiconductor device 1.

The SiC semiconductor device 1 is configured using a substrate 10 made of SiC and having n$^+$-type. On a surface of the substrate 10, an epitaxial layer 20 made of SiC is disposed. The epitaxial layer 20 of the present embodiment has a configuration in which a buffer layer 21 of n$^-$-type, a drift layer 22 of n$^-$-type, and a base layer 23 of p-type are stacked in this order.

The epitaxial layer 20 of the present embodiment has a thickness of about 4 to 300 μm when the length along the normal direction to the surface direction of the substrate 10 is defined as film thickness. The epitaxial layer 20 has an impurity concentration of $5.0 \times 10^{13}$ to $1.0 \times 10^{19}$ cm$^{-3}$. As will be specifically described later, in the epitaxial layer 20, the trap densities of Ti and Cr in the activation energy of 0.10 to 0.20 eV measured by a DLTS (abbreviation of Deep Level Transient Spectroscopy) method are each $1.0 \times 10^{13}$ cm$^{-3}$ or less.

In a surface layer portion of the base layer 23, a source region 24 of n$^+$-type is disposed. Note that the source region 24 is formed by performing ion implantation on the surface layer portion of the base layer 23 or forming a groove in the base layer 23 and disposing an epitaxial layer of n-type in the groove.

The substrate 10 has, for example, a specific resistance of 30 mΩ·cm or less (for example, 20 mΩ·cm). The substrate 10 has a front surface of a (0001) Si plane, and has an off angle of 0.5 to 5 degrees with respect to the (0001) Si plane. As will be specifically described later, the substrate 10 has a Ti density and a Cr density of $1.0 \times 10^{17}$ cm$^{-3}$ or less measured by a secondary ion mass spectrometry (SIMS) method. In the present embodiment, the substrate 10 forms a drain layer of the MOSFET.

The buffer layer 21 has, for example, an n-type impurity concentration of $1.0 \times 10^{16}$ to $1.0 \times 10^{19}$ cm$^{-3}$. The drift layer 22 has an n-type impurity concentration of $1.0 \times 10^{14}$ cm$^{-3}$ or less in order to form an ultra-high breakdown voltage device.

The base layer 23 is a portion where a channel region is formed, and has, for example, a p-type impurity concentration of about $3.0 \times 10^{17}$ cm$^{-3}$ and a thickness of 0.5 to 2 μm. The source region 24 has a higher impurity concentration than the drift layer 22. For example, an n-type impurity concentration in a surface layer portion of the source region 24 is about $2.5 \times 10^{18}$ to $1.0 \times 10^{19}$ cm$^{-3}$, and the source region 24 has a thickness of 0.5 to 2 μm. Note that the film thicknesses and the like of the drift layer 22, the base layer 23, and the source region 24 may be set to any values and are not limited to the above examples.

A trench 30 is formed so as to penetrate the base layer 23 and the source region 24 and reach the drift layer 22. The base layer 23 and the source region 24 are disposed so as to be in contact with a side surface of the trench 30. Although only one trench 30 is illustrated in FIG. 1, the trench 30 is actually formed in a stripe shape in which plural trenches are arranged at equal intervals in a left-right direction on a paper surface of FIG. 1.

A gate insulating film 31 is formed on a wall surface of the trench 30. A gate electrode 32 made of doped polysilicon is formed on a surface of the gate insulating film 31. The trench 30 is filled with the gate insulating film 31 and the gate electrode 32. In the present embodiment, a trench gate structure is configured in this manner.

An upper electrode 41 serving as a source electrode is disposed on the epitaxial layer 20. The upper electrode 41 is insulated from the gate electrode 32 and connected to the base layer 23 and the source region 24. In the present embodiment, the upper electrode 41 is made of plural metals such as Ni and Al. A portion of the metals in contact with a portion forming an n-type SiC (that is, the source region 24) is made of a metal capable of making ohmic contact with the n-type SiC. In addition, at least a portion of the metals in contact with a portion forming a p-type SiC (that is, the base layer 23) is made of a metal capable of making ohmic contact with the p-type SiC.

A lower electrode 42 serving as a drain electrode electrically connected to the substrate 10 is formed on a rear surface of the substrate 10. In the present embodiment, with such a structure, MOSFET of an n-channel type inverted trench gate structure is formed. The cell region is formed by arranging the MOSFETs.

The basic structure of the semiconductor device 1 according to the present embodiment is described above. In the SiC semiconductor device 1, when a predetermined gate voltage is applied to the gate electrode 32, an inversion layer is formed in a portion of the base layer 23 in contact with the trench 30, and a current flows between the upper electrode 41 and the lower electrode 42. That is, a current flows along the stacking direction of the substrate 10 and the epitaxial layer 20.

As described above, when the SiC semiconductor device 1 has an ultrahigh breakdown voltage of 10 kV or more, the impurity concentration of the drift layer 22 is preferably $1.0 \times 10^{14}$ cm$^{-3}$ or less. When the impurity concentration of the drift layer 22 is set to $1.0 \times 10^{14}$ cm$^{-3}$ or less, the trap density of the drift layer 22 (that is, the epitaxial layer 20) is desirably set to $1.0 \times 10^{13}$ cm$^{-3}$ or less so as not to affect the breakdown voltage.

At present, the SIMS method is often used as a method for analyzing the trap density. However, it is reported that it is difficult to detect the trap density of $1.0 \times 10^{14}$ cm$^{-3}$ or less by the SIMS method. Therefore, the present inventor studies evaluation of the trap density of the epitaxial layer 20 using the DLTS method capable of evaluating the trap density up to about $1.0 \times 10^{11}$ cm$^{-3}$, and obtains the results shown in FIG. 2.

Figure 2:
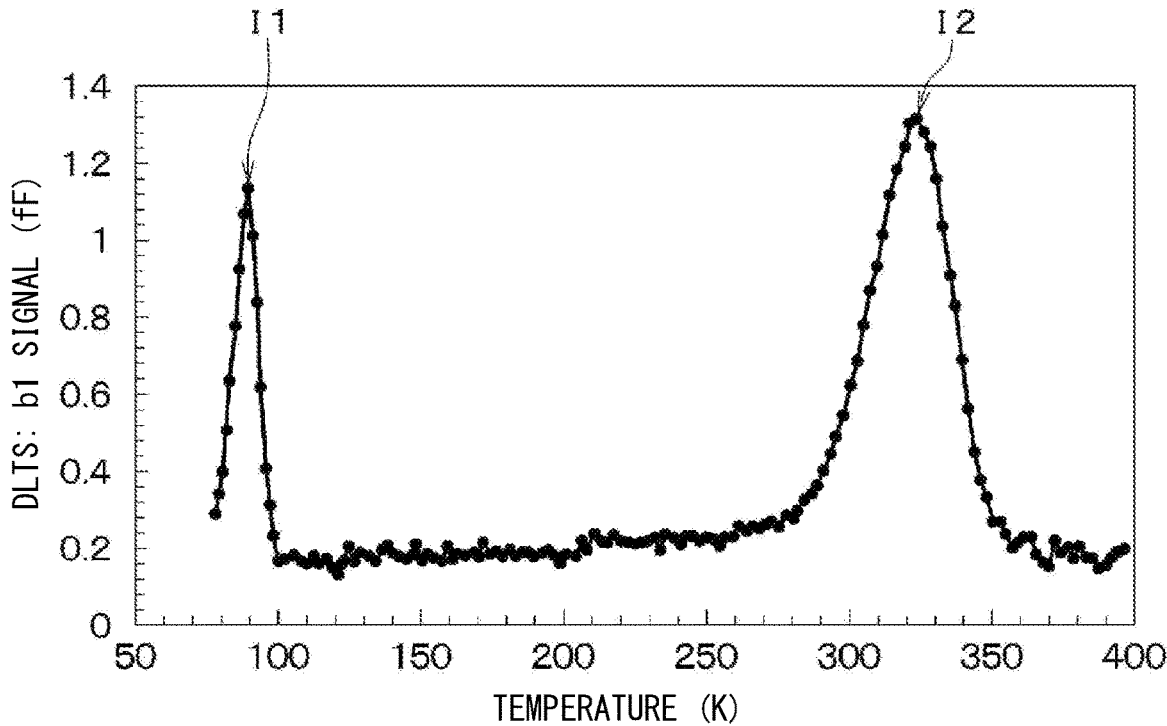
FIG. 2 is a graph showing a relationship between a temperature and a signal obtained by a DLTS method.

As shown in FIG. 2, in the DLTS method, it was confirmed that the defect peak I1 was present around 90 K. When the activation energy is derived based on the defect peak I1, the activation energy is 0.1 to 0.2 eV. That is, it can be said that the epitaxial layer 20 has the defect peak I1 at the activation energy of 0.10 to 0.20 eV measured by the DLTS method. The defect peak I1 corresponds to the defect level of Ti and Cr. That is, it can be said that the defect peak I1 is caused by Ti and Cr. The peak I2 in FIG. 2 is caused by carbon vacancies. FIG. 2 is a result of forming a Schottky electrode and evaluating after manufacturing a SiC wafer 100 to be described later. FIG. 2 is a result when the interval period in the DLTS method is set to 19.2 ms. In this case, the Schottky electrode may be formed uniformly over the entire SiC wafer 100 described later, or may be formed as a TEG.

Figure 3:
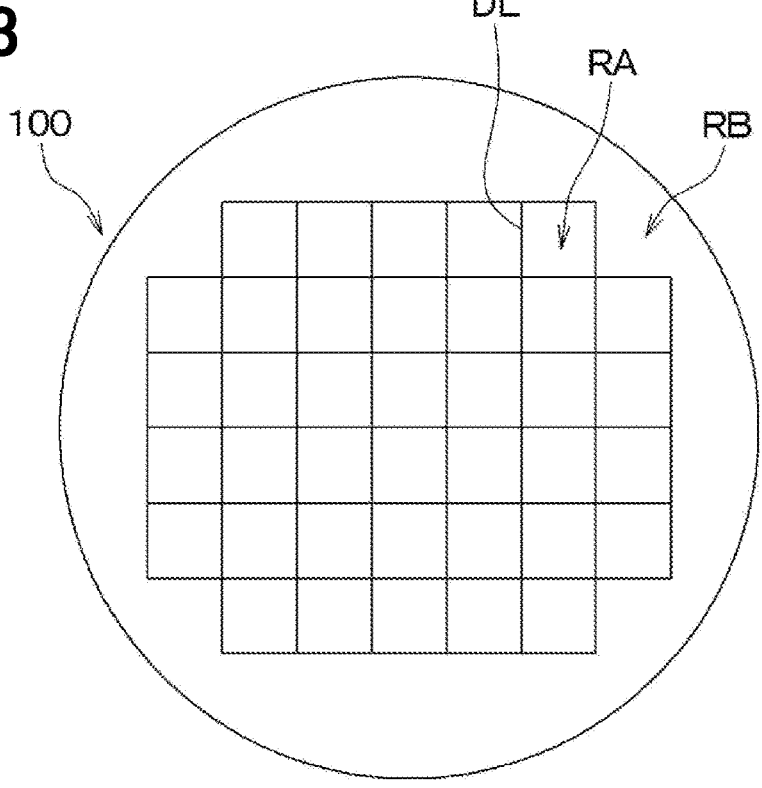
FIG. 3 is a plan view of a SiC wafer.

The cause of incorporation of Ti and Cr into the epitaxial layer 20 is considered to be the influence of each member, the source gas, and the substrate 10 serving as a base when the epitaxial layer 20 is grown. Specifically, the SiC semiconductor device 1 as described above is manufactured as follows. First, the wafer-like substrate 10 is prepared, and the epitaxial layer 20 is grown on the substrate 10. As shown in FIG. 3, the SiC wafer 100 having plural chip formation regions RA and an outer peripheral region RB surrounding the chip formation regions RA is manufactured. Each of the chip formation regions RA is partitioned by a dicing line DL. The SiC semiconductor device 1 is manufactured by performing a predetermined semiconductor manufacturing process such as ion implantation in each chip forming region RA to form a semiconductor element having the source region 24 and the like, and then dividing the chip forming region RA into chip units along the dicing line DL.

The outer peripheral region RB is, for example, 3 mm away from the end of the SiC wafer 100 in the surface direction. The thicknesses and impurity concentrations of the buffer layer 21, the drift layer 22, and the like (that is, the epitaxial layer 20) are the same in the state of the SiC wafer 100.

In this case, the SiC wafer 100 is manufactured by disposing the substrate 10 on a pedestal in a chamber constituting a reaction chamber, introducing a reaction gas such as silane or propane into the chamber while controlling the temperature in the chamber, and growing the epitaxial layer 20 on the substrate 10.

A material having as high purity as possible is usually used as members forming the chamber and the reaction gas for growing the epitaxial layer 20, in order to improve the crystal quality of the epitaxial layer 20. For example, each member such as a chamber is formed of an extremely high purity carbon member or a member covered with a high purity carbon coding film. Therefore, it is considered that Ti and Cr in the substrate 10 are taken into the epitaxial layer 20 as degassing when the epitaxial layer 20 is grown on the substrate 10. Then, the present inventor diligently studies the relationship between the Ti density in the substrate 10 and the Ti trap density in the epitaxial layer 20, and obtains the results shown in FIG. 4. The Ti density in the substrate 10 is measured by the SIMS method, and the Ti trap density in the epitaxial layer 20 is measured by the DLTS method.

Figure 4:
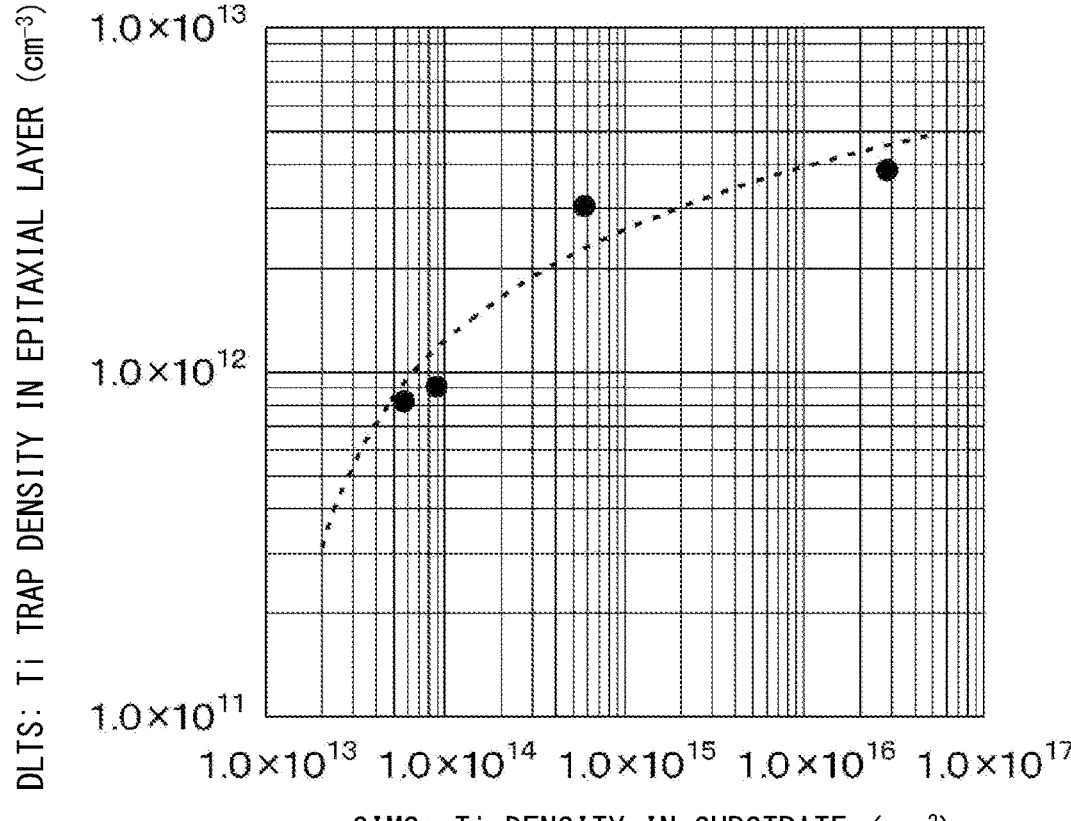
FIG. 4 is a graph showing a relationship between a Ti density in a substrate measured by a SIMS method and a Ti trap density in an epitaxial layer obtained by a DLTS method.

As shown in FIG. 4, it is confirmed that the higher the Ti density in the substrate 10, the higher the Ti trap density in the epitaxial layer 20. Then, it is confirmed that in order to set the Ti trap density in the epitaxial layer 20 to $1.0 \times 10^{13}$ cm$^{-3}$ or less, the Ti density in the substrate 10 may be set to $1.0 \times 10^{17}$ cm$^{-3}$ or less. Although the Ti density has been described here, the same results are obtained for Cr. Therefore, in the present embodiment, the Ti density and the Cr density of the substrate 10 are set to $1.0 \times 10^{17}$ cm$^{-3}$ or less.

Further, when the SiC wafer 100 is manufactured as described above, the end portion of the wafer becomes the outer peripheral region RB in which the semiconductor element is not formed. Therefore, at least in the chip formation region RA, the epitaxial layer 20 has the trap density of Ti and Cr of $1.0 \times 10^{13}$ cm$^{-3}$ or less.

Furthermore, in the epitaxial layer 20, it is preferable that the deviation of the carrier concentration distribution along the surface direction of the substrate 10 is set to be within 15% in order to suppress a decrease in yield when the SiC semiconductor device 1 is configured. In this case, specifically, it is preferable that the deviation of the carrier concentration distribution along the plane direction of the epitaxial layer 20 positioned in each chip formation region RA is set to be within 15%. The deviation is calculated by a target concentration TC and an average concentration AC in the plane, and is represented by the formula of $-15\% \leq (AC-TC)/TC \leq 15\%$.

The substrate 10 is usually obtained by cutting a SiC ingot. Specifically, the SiC ingot is obtained by a high temperature CVD (abbreviation of chemical vapor deposition) method or a sublimation method. More specifically, the SiC ingot is manufactured by disposing a seed substrate made of SiC in a chamber, and growing an epitaxial layer on the seed substrate by introducing a reaction gas such as silane or propane into the chamber while controlling the temperature in the chamber by a heating device disposed around the chamber or the like. Also in the production of the SiC ingot, Ti and Cr are taken as degassing from the seed substrate into the epitaxial layer. Therefore, when a seed substrate having a Ti density and a Cr density of $1.0 \times 10^{17}$ cm$^{-3}$ or less is used for manufacturing a SiC ingot, a SiC ingot (that is, the substrate 10) having a Ti density and a Cr density of $1.0 \times 10^{17}$ cm$^{-3}$ or less can be manufactured.

According to the present embodiment, the Ti density and the Cr density of the substrate 10 are set to $1.0 \times 10^{17}$ cm$^{-3}$ or less. Therefore, the trap density caused by Ti and Cr in the epitaxial layer 20 can be $1.0 \times 10^{13}$ cm$^{-3}$ or less, and the SiC wafer 100 can be manufactured to have an ultrahigh breakdown voltage. In addition, before the epitaxial layer 20 is grown on the substrate 10, it is only necessary to confirm whether or not each of the Ti density and the Cr density of the substrate 10 is $1.0 \times 10^{17}$ cm$^{-3}$ or less by the SIMS method. Thus, it is possible to obtain the SiC semiconductor device 1 with high reliability without significantly increasing the number of manufacturing steps. Similarly, after the epitaxial layer 20 is grown on the substrate 10, it is only necessary to confirm whether or not the trap density of Ti and Cr in the epitaxial layer 20 is $1.0 \times 10^{13}$ cm$^{-3}$ or less by the DLTS method. Thus, a highly reliable SiC semiconductor device can be obtained without significantly increasing the number of manufacturing steps. Note that each requirement for the substrate 10 and the epitaxial layer 20 may be checked after the epitaxial layer 20 is grown. In case of confirming these requirements, CV measurement may be further performed to confirm an effective impurity concentration.

(1) In the present embodiment, in the epitaxial layer 20 of the SiC wafer 100, the deviation of the carrier concentration distribution along the plane direction of the substrate 10 is set to be within 15%. Therefore, it is possible to suppress a decrease in yield when manufacturing the SiC semiconductor device 1.

(2) In the present embodiment, a part of the epitaxial layer 20 has an impurity concentration of $5.0 \times 10^{13}$ to $1.0 \times 10^{19}$ cm$^{-3}$ and a film thickness of 4 to 300 μm. The buffer layer 21 has an impurity concentration of $1.0 \times 10^{16}$ to $1.0 \times 10^{19}$ cm$^{-3}$, and the drift layer 22 has an impurity concentration of $1.0 \times 10^{14}$ cm$^{-3}$ or less. Therefore, the MOSFET can have an ultrahigh breakdown voltage.

Although the present disclosure has been described in accordance with the embodiment, it is understood that the present disclosure is not limited to such embodiments or structures. The present disclosure encompasses various modifications and variations within the scope of equivalents. In addition, various combinations and forms, and further, other combinations and forms including only one element, or more or less than these elements are also within the sprit and the scope of the present disclosure.

For example, in the embodiment, the SiC semiconductor device 1 includes the MOSFET. However, the SiC semiconductor device 1 may include a Schottky diode or a pn diode.

In the embodiment, the MOSFET has the n-channel type trench gate structure in which a first conductivity type is n-type and a second conductivity type is p-type. However, the semiconductor device 1 may have a MOSFET with a p-channel type trench gate structure in which the conductivity type of each component is inverted with respect to the n-channel type. Other than the MOSFET, the SiC semiconductor device 1 may have an IGBT with a similar structure. The IGBT is the same as the MOSFET described in the first embodiment except that the n$^+$-type substrate 10 in the first embodiment is changed to the p$^+$-type substrate 10.

What is claimed is:

1. A silicon carbide wafer made of silicon carbide comprising:

a substrate made of silicon carbide; and an epitaxial layer made of silicon carbide and arranged on the substrate, wherein a chip formation region is defined in which a semiconductor element is formed, and an outer peripheral region is defined to surround the chip formation region, the epitaxial layer has a trap density of $1.0 \times 10^{13}$ cm$^{-3}$ or less at an activation energy of 0.10 to 0.20 eV derived by a DLTS method in the chip formation region, and the substrate has a Ti density of $1.0 \times 10^{17}$ cm$^{-3}$ or less measured by a SIMS method and a Cr density of $1.0 \times 10^{17}$ cm$^{-3}$ or less measured by a SIMS method.

2. The silicon carbide wafer according to claim 1, wherein the epitaxial layer has a deviation in a carrier concentration distribution along a plane direction of the substrate, and the deviation is within 15%.

3. The silicon carbide wafer according to claim 1, wherein a part of the epitaxial layer has an impurity concentration of $5.0 \times 10^{13}$ to $1.0 \times 10^{19}$ cm$^{-3}$.

4. The silicon carbide wafer according to claim 1, wherein the epitaxial layer has a thickness of 4 to 300 μm.

5. The silicon carbide wafer according to claim 1, wherein the epitaxial layer includes a buffer layer located adjacent to the substrate and a drift layer located on the buffer layer, and the buffer layer has an impurity concentration of $1.0 \times 10^{16}$ to $1.0 \times 10^{19}$ cm$^{-3}$.

6. A silicon carbide semiconductor device comprising: the silicon carbide wafer according to claim 1; and a semiconductor element in which a current flows along a stacking direction of the substrate and the epitaxial layer.

* * * * *